United States Patent
Price et al.

(10) Patent No.: US 10,536,143 B1
(45) Date of Patent: Jan. 14, 2020

(54) COMPARATOR ARCHITECTURE AND RELATED METHODS

(71) Applicant: QUALCOMM Incorporated, San Diego, CA (US)

(72) Inventors: Burt Lee Price, Apex, NC (US); Dhaval Shah, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/570,173

(22) Filed: Sep. 13, 2019

Related U.S. Application Data

(63) Continuation of application No. 15/995,069, filed on May 31, 2018, now Pat. No. 10,461,738.

(51) Int. Cl.
  *H03K 17/22* (2006.01)
  *G06F 1/24* (2006.01)
  *G01R 19/165* (2006.01)

(52) U.S. Cl.
  CPC ..... *H03K 17/223* (2013.01); *G01R 19/16576* (2013.01); *G06F 1/24* (2013.01); *H03K 17/22* (2013.01)

(58) Field of Classification Search
  CPC ........ H03K 17/22; H03K 17/223; G06F 1/24; G01R 19/16576
  See application file for complete search history.

(56) References Cited

U.S. PATENT DOCUMENTS

| | | |
|---|---|---|
| 5,453,704 A | 9/1995 | Kawashima |
| 5,883,532 A | 3/1999 | Bowers |

(Continued)

FOREIGN PATENT DOCUMENTS

| | | |
|---|---|---|
| WO | 9523472 A1 | 8/1995 |

OTHER PUBLICATIONS

Baker R.J., et al., "CMOS Circuit Design, Layout, and Simulation", Chapter 26, Figure 26.11, Sep. 7, 2010, 1 page.

(Continued)

*Primary Examiner* — Thomas J. Hiltunen
(74) *Attorney, Agent, or Firm* — Muncy, Geissler, Olds & Lowe, P.C./Qualcomm

(57) ABSTRACT

A system is disclosed. The system includes a first stage configured to receive $V_{IN}$ and $V_{REF}$, the first stage including an input transistor pair, wherein the input voltage is coupled to the input transistor pair, the input transistor pair is coupled to ground, and the input transistor pair includes at a common drain a high-gain node having a voltage $V_{HGN}$. The system further include a second stage coupled to the high-gain node and configured to generate $V_{OUT}$ based on a difference between $V_{IN}$ and $V_{REF}$, the second stage comprising a resistor and an inverter transistor pair, wherein the gates of the inverter transistor pair are coupled to the high-gain node of the first stage and the resistor couples the high-gain node of first stage to a common drain of the inverter transistor pair and is configured to provide and/or draw current to and/or from the high-gain node of first stage.

30 Claims, 5 Drawing Sheets

(56) References Cited

U.S. PATENT DOCUMENTS

| | | | | |
|---|---|---|---|---|
| 5,886,567 A * | 3/1999 | Park | ................ | G01R 19/16519 327/537 |
| 6,184,724 B1 * | 2/2001 | Lin | ................ | G01R 19/16552 327/143 |
| 6,236,249 B1 | 5/2001 | Choi et al. | | |
| 6,879,194 B1 | 4/2005 | Caldwell | | |
| 7,312,644 B2 | 12/2007 | Messager | | |
| 7,482,847 B2 * | 1/2009 | Suzuki | ................ | H03K 17/223 327/143 |
| 7,612,588 B2 * | 11/2009 | Kimura | ................ | H03K 17/223 327/142 |
| 7,656,210 B2 | 2/2010 | Seki et al. | | |
| 8,106,688 B2 | 1/2012 | Huang et al. | | |
| 8,253,453 B2 * | 8/2012 | Vilas Boas | .......... | H03K 17/223 327/143 |
| 8,949,584 B2 | 2/2015 | Jeong et al. | | |
| 9,007,096 B1 | 4/2015 | Carey et al. | | |
| 9,397,654 B2 | 7/2016 | Lou | | |
| 9,473,016 B2 | 10/2016 | Hidaka | | |
| 9,525,407 B2 * | 12/2016 | Iriarte | ................ | H03K 5/2472 |
| 9,941,884 B2 | 4/2018 | Rezayee et al. | | |
| 10,461,738 B1 | 10/2019 | Price | | |
| 2003/0141935 A1 | 7/2003 | Chen et al. | | |
| 2005/0083127 A1 | 4/2005 | Moraveji | | |
| 2008/0157832 A1 * | 7/2008 | Park | .......................... | G06F 1/24 327/143 |
| 2008/0197910 A1 * | 8/2008 | Isomura | ............ | B60H 1/00428 327/520 |
| 2008/0218223 A1 | 9/2008 | Kimura | | |
| 2015/0200653 A1 | 7/2015 | Kim | | |
| 2016/0156347 A1 | 6/2016 | Usuda | | |
| 2017/0227409 A1 | 8/2017 | Wadhwa | | |
| 2018/0026527 A1 | 1/2018 | Tai | | |

OTHER PUBLICATIONS

International Search Report and Written Opinion—PCT/US2019/027779—ISA/EPO—dated Jul. 16, 2019.

\* cited by examiner

COMPARATOR ARCHITECTURE AND RELATED METHODS

CROSS-REFERENCE TO RELATED APPLICATIONS

The present Application for Patent is a continuation of patent application Ser. No. 15/995,069 entitled "COMPARATOR ARCHITECTURE AND RELATED METHODS" filed May 31, 2018, pending, assigned to the assignee hereof, and expressly incorporated by reference in its entirety.

INTRODUCTION

Aspects of this disclosure relate generally to comparator architecture, and more particularly to maximizing the speed of the comparator.

Comparators may be used to monitor voltage. In particular, the comparator will determine if an input voltage $V_{IN}$ is greater than or less than a reference voltage $V_{REF}$. The comparator may produce an output voltage $V_{OUT}$ that indicates whether $V_{IN}$ is greater than or less than $V_{REF}$. For example, if $V_{IN}$ is greater than $V_{REF}$, then $V_{OUT}$ may be high (logic-1), and if $V_{IN}$ is less than $V_{REF}$, $V_{OUT}$ may be low (logic-0).

$V_{REF}$ may be selected arbitrarily based on the application. For example, a device may include a power management system configured to keep the supply voltage of the device within an optimal range. If the supply voltage is outside of the optimal range, then processor speed and/or performance may be negatively affected. For example, if the power supply voltage is lower than the optimal value, then processing speeds may be reduced; and if the power supply voltage is higher than the optimal value, the device may consume excess power unnecessarily. To monitor the supply voltage, the power management system may use a voltage threshold monitor (VTM) that includes one or more comparators. The supply voltage of the device may be provided as the input voltage $V_{IN}$, and a limit of the optimal supply voltage may be provided as the reference voltage $V_{REF}$.

Suppose, for example, that the optimal range for a supply voltage of a particular device is one volt, plus or minus fifty millivolts. Accordingly, the VTM may provide a comparator with a reference voltage $V_{REF}$ of 1.05V. Using the $V_{REF}$, the comparator may determine if the device's supply voltage has exceeded the 1.05V reference threshold and is therefore outside of the optimal range. In this example, $V_{OUT}$ may provide a logic-0 output if the device's supply voltage is below the threshold and may provide a logic-1 output if the 1.05V threshold has been exceeded. Accordingly, a logic-1 output may indicate that the device's power supply voltage is exceeding the upper limit of its optimal range.

When the VTM indicates that the device's power supply voltage is, for example, too high, the power management system may make adjustments to reduce the device's power supply voltage to within the optimal range. It will be understood that the faster the adjustments can be made, the greater the boost in speed and/or performance. In conventional architectures, the one or more comparators that make up the VTM may not be capable of switching quickly. The speed of the comparator may be viewed as an amount of time it takes for $V_{OUT}$ to flip from logic-0 to logic-1 in response to a movement of $V_{IN}$ above $V_{REF}$.

To return to the earlier example, suppose that the device's power supply voltage is initially within the optimal range. As a result, the output voltage $\backslash T_{OUT}$ of the comparator may be logic-0, signifying that the device's supply voltage is not excessive. If the device's power supply voltage later rises above $V_{REF}$, it may take approximately four-hundred picoseconds for $\backslash T_{OUT}$ to flip from the logic-0 output to the logic-1 output. At this point, the power management system will sense that the power supply voltage is too high, and can take action to adjust the power supply voltage. However, the four-hundred picosecond delay prevents the power management system from correcting the supply voltage as effectively as it could if there were less delay. Accordingly, new techniques are needed to increase the speed of the one or more comparators.

SUMMARY

The following summary is an overview provided solely to aid in the description of various aspects of the disclosure and is provided solely for illustration of the aspects and not limitation thereof.

In accordance with aspects of the disclosure, a system is disclosed. The system comprises a first stage configured to receive an input voltage and a reference voltage, the first stage including an input transistor pair, wherein the input voltage is coupled to the input transistor pair, the input transistor pair is coupled to ground, and the input transistor pair includes at a common drain a high-gain node having a high-gain node voltage. The system further comprises a second stage coupled to the high-gain node and configured to generate an output voltage based on a difference between the input voltage and the reference voltage, the second stage comprising a resistor and an inverter transistor pair, wherein the gates of the inverter transistor pair are coupled to the high-gain node of the first stage and the resistor couples the high-gain node of the first stage to a common drain of the inverter transistor pair and is configured to provide and/or draw current to and/or from the high-gain node of the first stage.

In accordance with other aspects of the disclosure, a method is disclosed. The method comprises receiving, at a first stage including an input transistor pair, an input voltage and a reference voltage, wherein the input voltage is coupled to the input transistor pair, the input transistor pair is coupled to ground, and the input transistor pair includes at a common drain a high-gain node having a high-gain node voltage. The method further comprises receiving, at a second stage including a resistor and an inverter transistor pair, the high-gain node voltage, wherein the gates of the inverter transistor pair are coupled to the high-gain node of the first stage and the resistor couples the high-gain node of the first stage to a common drain of the inverter transistor pair. The method further comprises providing or drawing current to or from the high-gain node of the first stage and generating an output voltage based on a difference between the input voltage and the reference voltage.

In accordance with other aspects of the disclosure, another system is disclosed. The system comprises means for receiving an input voltage and a reference voltage, wherein the means for receiving comprises means for providing a high-gain node having a high-gain node voltage, means for receiving the high-gain node voltage, means for providing or drawing current to or from the high-gain node of the first stage, and means for generating an output voltage based on a difference between the input voltage and the reference voltage.

BRIEF DESCRIPTION OF THE DRAWINGS

The accompanying drawings are presented to aid in the description of various aspects of the disclosure and are provided solely for illustration of the aspects and not limitation thereof.

DETAILED DESCRIPTION

As noted above, a comparator fabricated using conventional architectures may not be capable of switching quickly. For example, it may take four hundred picoseconds for \T$_{OUT}$ to flip from logic-0 to logic-1 in response to a movement of the input voltage V$_{IN}$ to outside of the optimal range (or for \T$_{OUT}$ to flip from logic-1 to logic-0 in response to a movement of V$_{IN}$ to within the optimal range). The four-hundred picosecond delay may delay the power management system, and reduce the speed and/or performance gains associated with power management algorithms.

As will be discussed in greater detail below, the comparator architectures of the present disclosure may reduce the delay to less than one-hundred picoseconds. In one implementation, the comparator may include a high-gain stage and an inverter stage, wherein the inverter stage assists the high-gain stage by providing current thereto, or draining current therefrom. In another implementation, the comparator may further include a high-impedance stage to prevent the comparator from drawing power away from the input voltage V$_{IN}$ and/or reference voltage V$_{REF}$. In yet another implementation, the comparator may include a cascode differential-to-single ended converter and/or a protective voltage clamp.

Figure 1:
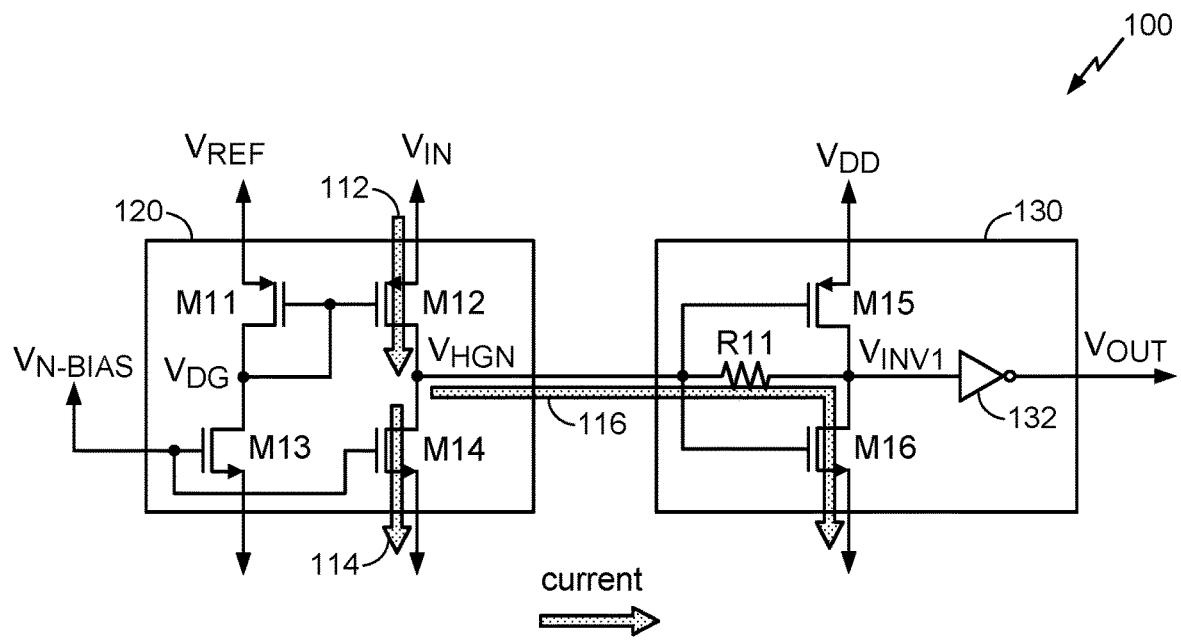
FIG. 1 generally illustrates a comparator architecture in accordance with aspects of the disclosure, at a time when an input voltage rises above a reference voltage.

FIG. 1 generally illustrates a comparator architecture 100 in accordance with aspects of the disclosure, at a time when an input voltage rises above a reference voltage.

The comparator architecture 100 may include a high-gain stage 120 and an inverter stage 130. As will be discussed in greater detail below, a rising input voltage V$_{IN}$ may cause current to flow out of the high-gain stage 120 and into the inverter stage 130.

The high-gain stage 120 may include two transistor pairs, each including a p-type transistor and an n-type transistor. A reference pair may include a transistor M11 as the p-type transistor and a transistor M13 as the n-type transistor. An input pair may include a transistor M12 as the p-type transistor and a transistor M14 as the n-type transistor. The n-type transistors (transistor M13 and transistor M14) may each include a source coupled to ground and a gate coupled to a bias voltage V$_{N-BIAS}$. V$_{N-BIAS}$ may be selected so that the n-type transistors are biased into an ON position. The transistor M11 may include a source coupled to a reference voltage V$_{REF}$. The transistor M12 may include a source coupled to an input voltage V$_{IN}$.

The drains of the transistors in the reference pair (transistor M11 and transistor M13) may be coupled to a drain-gate node having a drain-gate voltage V$_{DG}$. The drain-gate node may be coupled to the gates of the p-type transistors (transistor M11 and transistor M12). The drains of the transistors in the input pair (transistor M12 and transistor M14) may be common drains coupled to a high-gain node having a high-gain node voltage V$_{HGN}$. The high-gain node may be coupled to the inverter stage 130, as will be discussed in greater detail below. The high-gain stage 120 may include a delta-Vgs circuit.

The inverter stage 130 may include a first inverter comprising a transistor M15, a transistor M16, and a resistor R11. The inverter stage 130 may further include a second inverter 132. The transistor M15 may be a p-type transistor with a source coupled to a power supply voltage V$_{DD}$ and a drain coupled to a first inverter node having a first inverter node voltage V$_{INV1}$. The transistor M16 may be an n-type transistor with a source coupled to ground and a drain coupled to the first inverter node. The inverter stage 130 may include a class-A biased inverter.

The high-gain node of the high-gain stage 120 may be coupled to the gates of the transistor M15 and the transistor M16. Additionally, the resistor R11 may couple the high-gain node to the first inverter node. The first inverter node may be coupled to the second inverter 132, which generates an output voltage V$_{OUT}$ of the comparator architecture 100.

In the following paragraphs, the behavior of various components will be described in terms of a scenario where V$_{IN}$ is initially less than V$_{REF}$ (causing V$_{HGN}$ to be a low voltage) but later becomes greater than V$_{REF}$ (causing V$_{HGN}$ to rise from a low voltage to a high voltage).

When V$_{IN}$ rises above V$_{REF}$, there is a corresponding rise in V$_{HGN}$. To make V$_{HGN}$ rise, the transistor M12 is turned ON, causing an M12 current 112 passing through the transistor M12 to increase. As the M12 current 112 increases, V$_{HGN}$ rises correspondingly (toward V$_{IN}$). It will be understood that the faster the M12 current 112 increases, the faster V$_{HGN}$ reaches its ultimate value. As V$_{HGN}$ rises, the gate voltages of the transistor M15 and the transistor M16 also rise, which tends to turn the transistor M15 OFF while turning the transistor M16 ON.

From the high-gain node, the M12 current 112 may split into an M14 current 114 (running to ground through the transistor M14) and an M16 current 116 (running to ground through the resistor R11 and the transistor M16). It will be understood that if the resistor R11 were absent, then the M12 current 112 would equal the M14 current 114. Accordingly, the speed at which the M12 current 112 increases would be limited by the speed at which the M14 current 114 increases. However, as depicted in FIG. 1, the resistor R11 ensures an additional path to ground via the resistor R11 and the transistor M16. Because the resistor R11 sinks a portion of the M12 current 112 flowing into the high-gain node, the M12 current 112 is no longer strictly limited to an amount equal to that of the M14 current 114. As a result, the M12 current 112 may increase more quickly and V$_{HGN}$ may rise more quickly. Because V$_{HGN}$ is more responsive, the speed of the comparator is favorably increased.

Figure 2:
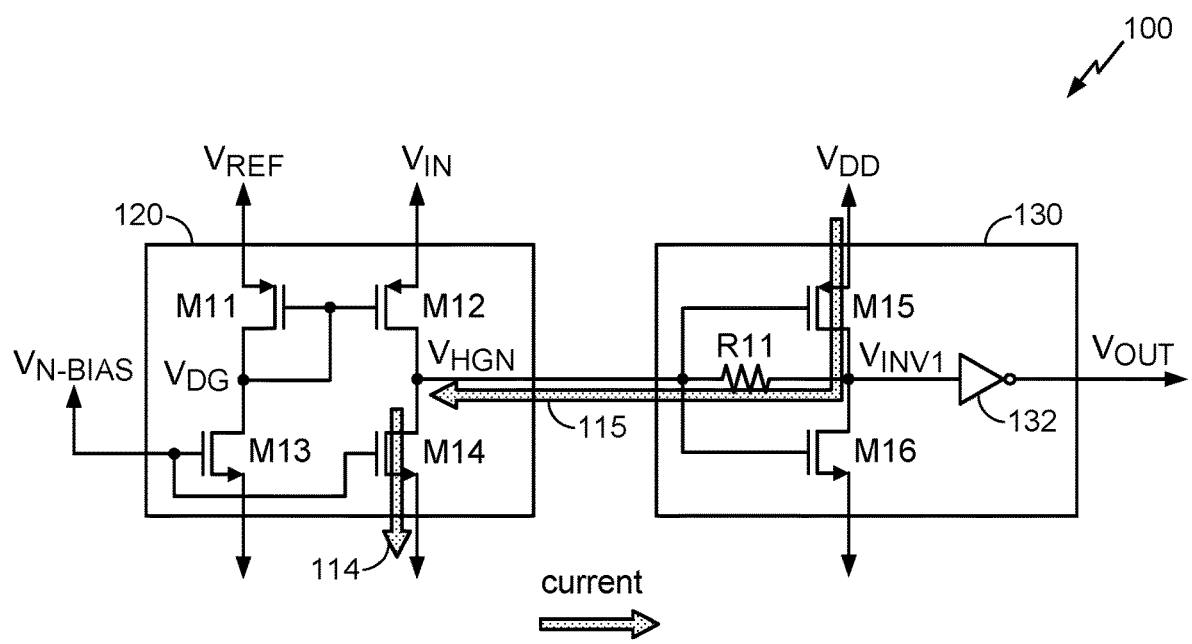
FIG. 2 generally illustrates the comparator architecture of FIG. 1, at a time when the input voltage falls below the reference voltage.

FIG. 2 generally illustrates the comparator architecture 100 of FIG. 1, at a time when the input voltage falls below the reference voltage. The structure of the comparator architecture 100 has been described in light of FIG. 1. For brevity, further discussion of the comparator architecture 100 will be omitted. In the following paragraphs, the behavior of various components will be described in terms of a scenario where $V_{IN}$ is initially greater than $V_{REF}$ (causing $V_{HGN}$ to be a high voltage) but later becomes less than $V_{REF}$ (causing $V_{HGN}$ to fall from a high voltage to a low voltage).

When $V_{IN}$ falls below $V_{REF}$, there is a corresponding reduction in $V_{HGN}$. To make $V_{HGN}$ fall, the transistor M12 is turned OFF, such that there is no current passing through the transistor M12. If $V_{N-BIAS}$ is a high voltage, then the transistor M14 is turned ON, enabling charge at the high-gain node to pass through the transistor M14 to ground (M14 current 114). As the M14 current 114 increases, $V_{HGN}$ falls correspondingly (toward ground). It will be understood that the faster the M14 current 114 increases, the faster $V_{HGN}$ reaches its ultimate value. As $V_{HGN}$ falls, the gate voltages of the transistor M15 and the transistor M16 also fall.

As depicted in FIG. 2, when $V_{HGN}$ falls, the transistor M15 is turned ON and the transistor M16 is turned OFF. The resistor R11 ensures that an M15 current 115 is drawn from the power supply voltage $V_{DD}$, through the transistor M15, and into the high-gain node via the resistor R11. Because the M15 current 115 is provided to the high-gain stage 120 from the inverter stage 130, the M14 current 114 may increase more quickly and the $V_{HGN}$ may fall more quickly. Because $V_{HGN}$ is more responsive, the speed of the comparator is favorably increased.

Figure 3:
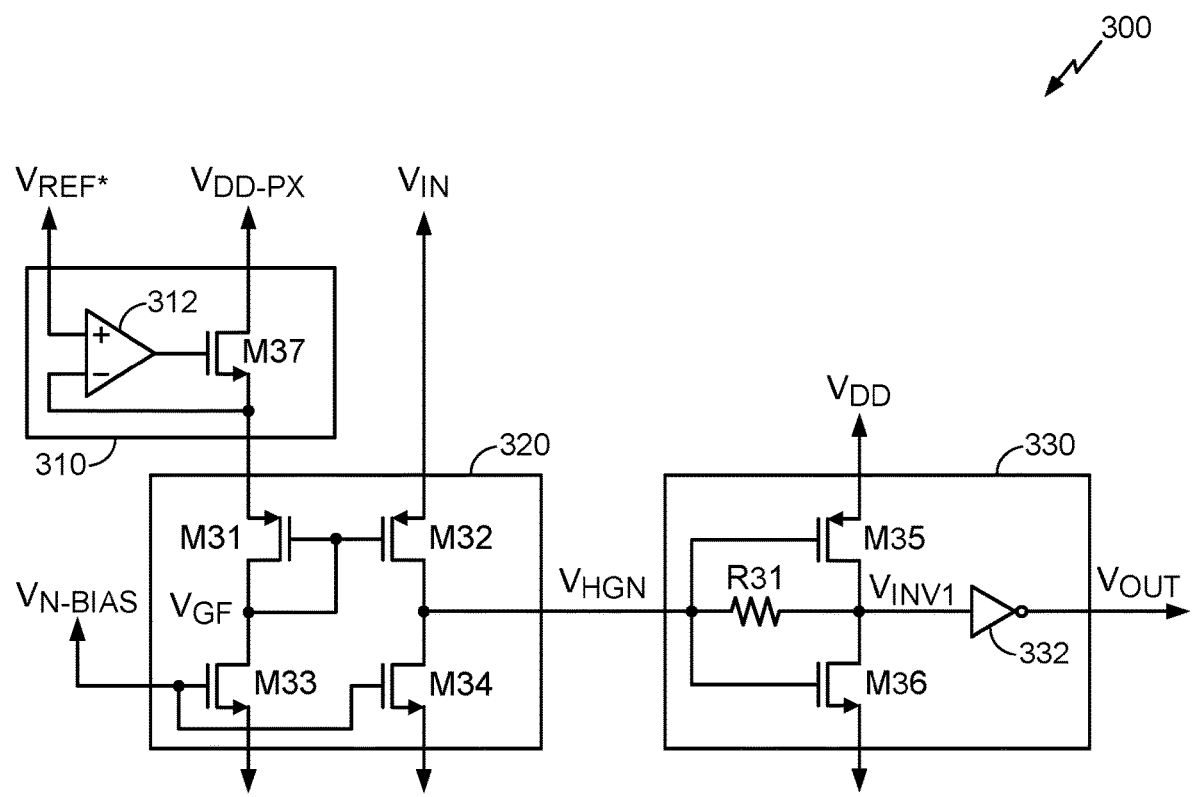
FIG. 3 generally illustrates a comparator architecture with increased impedance seen by a reference voltage in accordance with aspects of the disclosure.

FIG. 3 generally illustrates a comparator architecture 300 with increased impedance seen by a reference voltage in accordance with aspects of the disclosure.

The comparator architecture 300 may include a high-impedance stage 310, a high-gain stage 320, and an inverter stage 330.

The high-gain stage 320 may be analogous in some respects to the high-gain stage 120 depicted in FIGS. 1-2. For example, a transistor M31 may be analogous to the transistor M11, a transistor M32 may be analogous to the transistor M12, a transistor M33 may be analogous to the transistor M13, and a transistor M34 may be analogous to the transistor M14. The high-gain stage 320 may include a high-gain node having a $V_{HGN}$ that is provided to the inverter stage 330.

The inverter stage 330 may be analogous in some respects to the inverter stage 130 depicted in FIGS. 1-2. For example, a transistor M35 may be analogous to the transistor M15, a transistor M36 may be analogous to the transistor M16, a resistor R31 may be analogous to the resistor R11, and a second inverter 332 may be analogous to the second inverter 132.

The high-impedance stage 310 may be used to increase the impedance seen by the supplier of the reference voltage. As can be seen from FIG. 3, $V_{REF}$ is provided to the transistor M31 just as $V_{REF}$ was provided to the transistor M11 in FIGS. 1-2. However, unlike the scenario depicted in FIGS. 1-2, the supplier of the reference voltage may not be directly exposed to the transistor M31 or the high-gain stage 320 generally. Instead, the supplier of the reference voltage may supply a reference voltage $V_{REF*}$ which is coupled to a positive terminal of an operational amplifier 312. Because the operational amplifier 312 has a high input impedance, less current will be drawn from the supplier of the reference voltage, thereby improving the efficiency of the comparator.

The output of the operational amplifier 312 may be coupled to a gate of a transistor M37. The transistor M37 may be an n-type transistor having a drain coupled to a power supply $V_{DDPX}$. The power supply $V_{DD-PX}$ may be similar to $V_{DD}$, or in some implementations, may have a higher voltage than $V_{DD}$. A source of the transistor M37 may be coupled to a reference node having a voltage $V_{REF}$ analogous to the $V_{REF}$ depicted in FIGS. 1-2. The reference node may be coupled to the negative terminal of the operational amplifier 312 and to the high-gain stage 320, in particular, a source of the transistor M31.

It will be further understood that a high-impedance stage (not shown) analogous to the high-impedance stage 310 may be provided for the purpose of isolating the supplier of the input voltage $V_{IN}$. For example, the high-impedance stage may have a high-impedance input voltage $V_{IN*}$ and may provide to the high-gain stage 320 an input voltage $V_{IN}$.

Figure 4:
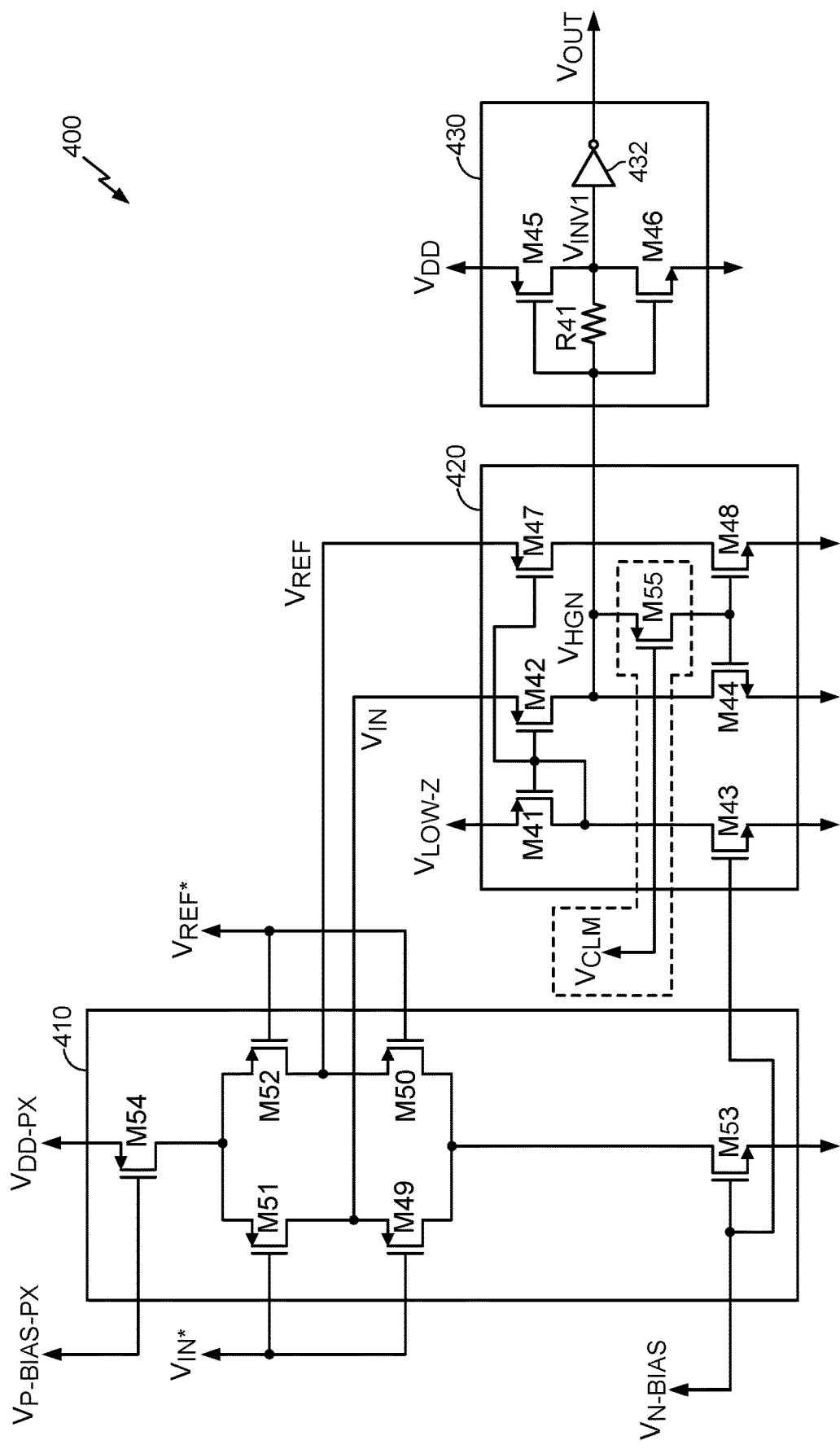
FIG. 4 generally illustrates a comparator architecture with increased impedance seen by a reference voltage and an input voltage.

FIG. 4 generally illustrates a comparator architecture 400 with increased impedance seen by a reference voltage and an input voltage in accordance with aspects of the disclosure.

The comparator architecture 400 may include a high-impedance stage 410, a high-gain stage 420, and an inverter stage 430.

The inverter stage 430 may be analogous in some respects to the inverter stage 130 depicted in FIGS. 1-2. For example, a transistor M45 may be analogous to the transistor M15, a transistor M46 may be analogous to the transistor M16, a resistor R41 may be analogous to the resistor R11, and a second inverter 432 may be analogous to the second inverter 132.

The high-gain stage 420 may be analogous in some respects to the high-gain stage 120 depicted in FIGS. 1-2 and the high-gain stage 320 depicted in FIG. 3. For example, a high-gain stage 420 may be provided with an input voltage $V_{IN}$ and a reference voltage $V_{REF}$. The high-gain stage 420 may also provide a high-gain node voltage $V_{HGN}$ to the inverter stage 430.

However, the high-gain stage 420 may differ in important respects from the high-gain stage 120 depicted in FIGS. 1-2 and the high-gain stage 320 depicted in FIG. 3. In particular, a low-impedance voltage $V_{LOW-Z}$ may be coupled to a low-impedance transistor pair. The low-impedance transistor pair may include a transistor M41 and a transistor M43. A source of the transistor M41 may be coupled to $V_{LOW-Z}$ and a source of the transistor M43 may be coupled to ground. The transistor M41 may be a p-type transistor. The drain of the transistor M41 may be coupled to the gate of the transistor M41 and a drain of a transistor M43. The transistor M43 may be an n-type transistor. A gate of the transistor M43 may be coupled to an n-type bias voltage $V_{N-BIAS}$.

The drain of the transistor M41 may also be coupled to a gate of a transistor M42 and a gate of a transistor M47. The transistor M42 and the transistor M47 may be p-type transistors. A source of the transistor M42 may be coupled to an input voltage $V_{IN}$ and a source of the transistor M47 may be coupled to a reference voltage $V_{REF}$. A drain of the transistor M42 may be coupled to a high-gain node analogous in some respects to the high-gain node depicted in FIGS. 1-3. In particular, the high-gain node may be coupled to the inverter stage 430 in a manner analogous to the way the high-gain node depicted in FIG. 1 is coupled to the inverter stage 130. Moreover, the high-gain node may be coupled to a drain of a transistor M44. The transistor M44 may be an n-type transistor with a source coupled to ground. A gate of the transistor M44 may be coupled to a gate of a transistor M48. The transistor M48 may also be an n-type transistor with a source coupled to ground. A drain of the transistor M48 may be coupled to the drain of the transistor M47. The high-gain stage 420 may include a folded cascode differential-to-single ended converter.

Optionally, an active clamp including a clamp transistor M55 may be provided as shown in FIG. 4. In particular, a source of the clamp transistor M55 may be coupled to the high-gain node, a drain of the clamp transistor M55 may be coupled to the gate and drain of transistor M48 and the gate of transistor M44, and a gate of the clamp transistor M55 may be coupled to a clamp voltage $V_{CLM}$. In some implementations, the n-type transistor coupled to the high-gain node (transistor M44) may have a higher speed, but a lower voltage rating than the p-type transistors. In order to protect the transistor M44 from high voltages (for example, the power supply voltage $V_{DD\text{-}PX}$), the active clamp may be provided. In particular, when $V_{HGN}$ gets too high, the clamp transistor M55 turns ON, allowing current to flow from the high-gain node to ground through the transistor M48.

The high-impedance stage 410 may be analogous in some respects to the high-impedance stage 310 depicted in FIG. 3. For example, the high-impedance stage 410 may be provided with a high-impedance input voltage $V_{IN*}$ and a high-impedance reference voltage $V_{REF*}$. The high-impedance stage 410 may also provide the input voltage $V_{IN}$ provided to the high-gain stage 420 and the reference voltage $V_{REF}$ provided to the high-gain stage 420.

However, the high-impedance stage 410 may differ in important respects from the high-impedance stage 310 depicted in FIG. 3. In particular, $V_{IN*}$ and $V_{REF*}$ may be coupled to gates of different transistor pairs. $V_{IN*}$ may be coupled to a high-impedance input transistor pair that includes a transistor M49 (which may be an n-type transistor) and a transistor M51 (which may be a p-type transistor). $V_{REF*}$ may be coupled to a high-impedance reference transistor pair that includes a transistor M50 (which may be an n-type transistor) and a transistor M52 (which may be a p-type transistor).

Sources of the p-type transistors (the transistor M51 and the transistor M52) may be coupled to a drain of a transistor M54 (which may be a p-type transistor). A source of the transistor M54 may be coupled to a power supply voltage $V_{DD\text{-}PX}$ and a gate of the transistor M54 may be coupled to a p-type bias voltage $V_{P\text{-}BIAS\text{-}PX}$.

Sources of the n-type transistors (the transistor M49 and the transistor M50) may be coupled to a drain of a transistor M53 (which may be an n-type transistor). A source of the transistor M53 may be coupled to ground and a gate of the transistor M54 may be coupled to the n-type bias voltage $V_{N\text{-}BIAS}$.

The drains of the transistor M49 and the transistor M51 may be coupled to an input node having a voltage $V_{IN}$ that is supplied to the high-gain stage 420. The drains of the transistor M50 and the transistor M52 may be coupled to a reference node having a voltage $V_{REF}$ that is also supplied to the high-gain stage 420. The high-impedance stage 410 may include a complementary symmetry difference pair.

Figure 5:
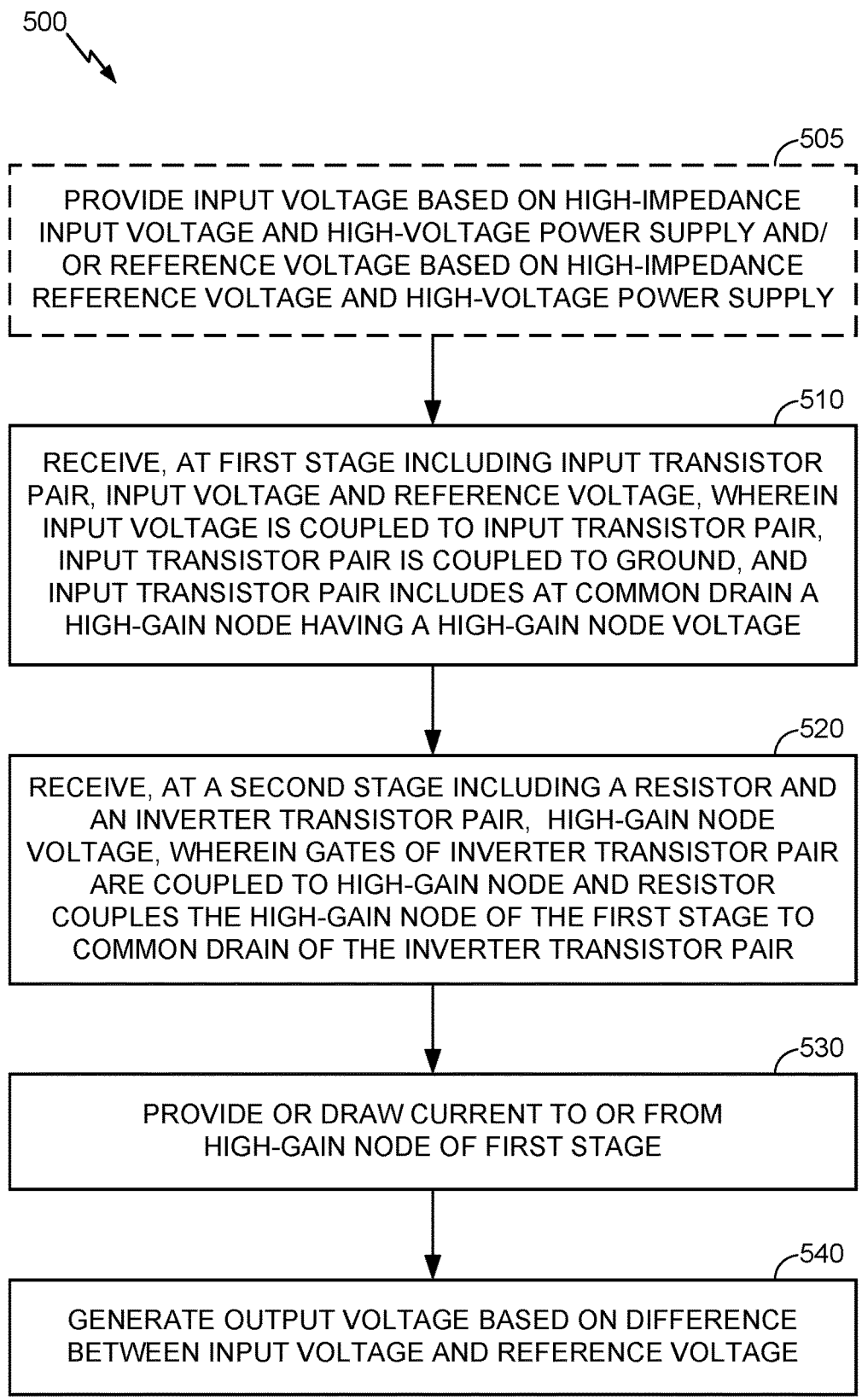
FIG. 5 generally illustrates a method for comparing an input voltage to a reference voltage in accordance with aspects of the disclosure.

FIG. 5 generally illustrates a method 500 for comparing an input voltage to a reference voltage in accordance with aspects of the disclosure. It will be understood that the method 500, or certain aspects thereof, may be performed in whole or in part by any suitable system in accordance with aspects of the disclosure, for example, the comparator architecture 100 depicted in FIGS. 1-2, the comparator architecture 300 depicted in FIG. 3, the comparator architecture 400 depicted in FIG. 4, etc.

At 505, the comparator architecture 400 optionally provides an input voltage based on a high-impedance input voltage and a high-voltage power supply and/or a reference voltage based on a high-impedance reference voltage and the high-voltage power supply. The providing at 505 may be performed by, for example, the high-impedance stage 310 and/or the high-impedance stage 410. Accordingly, the high-impedance stage 310 and/or the high-impedance stage 410 may constitute means increasing impedance.

At 510, the comparator architecture 400 receives, at a first stage including an input transistor pair, an input voltage and a reference voltage, wherein the input voltage is coupled to the input transistor pair, the input transistor pair is coupled to ground, and the input transistor pair includes at a common drain a high-gain node having a high-gain node voltage. The receiving at 510 may be performed by, for example, the high-gain stage 120 depicted in FIGS. 1-2, the high-gain stage 320 depicted in FIG. 3, and/or the high-gain stage 420 depicted in FIG. 4. Accordingly, the high-gain stage 120, the high-gain stage 320, and/or the high-gain stage 420 may constitute means for receiving an input voltage and a reference voltage and/or means for providing a high-gain node having a high-gain node voltage.

At 520, the comparator architecture 400 receives, at a second stage including a resistor and an inverter transistor pair, the high-gain node voltage, wherein the gates of the inverter transistor pair are coupled to the high-gain node of the first stage and the resistor couples the high-gain node of the first stage to a common drain of the inverter transistor pair. The receiving at 520 may be performed by, for example, the inverter stage 130 depicted in FIGS. 1-2, the inverter stage 330 depicted in FIG. 3, and/or the inverter stage 430 depicted in FIG. 4. Accordingly, the inverter stage 130, the inverter stage 330, and/or the inverter stage 430 may constitute means for receiving the high-gain node voltage.

At 530, the comparator architecture 400 provides or draws current to or from the high-gain node of the first stage. The providing or drawing at 530 may be performed by, for example, the inverter stage 130 depicted in FIGS. 1-2, the inverter stage 330 depicted in FIG. 3, and/or the inverter stage 430 depicted in FIG. 4. Accordingly, the inverter stage 130, the inverter stage 330, and/or the inverter stage 430 may constitute means for providing or drawing current to or from the high-gain node of the first stage.

At 540, the comparator architecture 400 generates an output voltage based on a difference between the input voltage and the reference voltage. The generating at 540 may be performed by, for example, the inverter stage 130 depicted in FIGS. 1-2, the inverter stage 330 depicted in FIG. 3, and/or the inverter stage 430 depicted in FIG. 4. Accordingly, the inverter stage 130, the inverter stage 330, and/or the inverter stage 430 may constitute means for generating an output voltage based on a difference between the input voltage and the reference voltage.

The functionalities depicted in FIG. 5 may be implemented in various ways consistent with the teachings herein. In some designs, the functionality may be implemented as one or more electrical components. In some designs, the functionality may be implemented as a processing system including one or more processor components. In some designs, the functionality may be implemented using, for example, at least a portion of one or more integrated circuits (e.g., an ASIC). As discussed herein, an integrated circuit may include a processor, software, other related components, or any combination thereof. Thus, the functionality of different modules may be implemented, for example, as different subsets of an integrated circuit, as different subsets of a set of software modules, or a combination thereof. Also, it will be appreciated that a given subset (e.g., of an integrated circuit and/or of a set of software modules) may provide at least a portion of the functionality for more than one module.

In addition, the functionalities depicted in FIG. 5, as well as other components and functions described herein, may be implemented using any suitable means. Such means also may be implemented, at least in part, using corresponding structure as taught herein. The components described above may also correspond to similarly designated "code for" functionality. Thus, in some aspects one or more of such means may be implemented using one or more of processor components, integrated circuits, or other suitable structure as taught herein.

Figure 6:
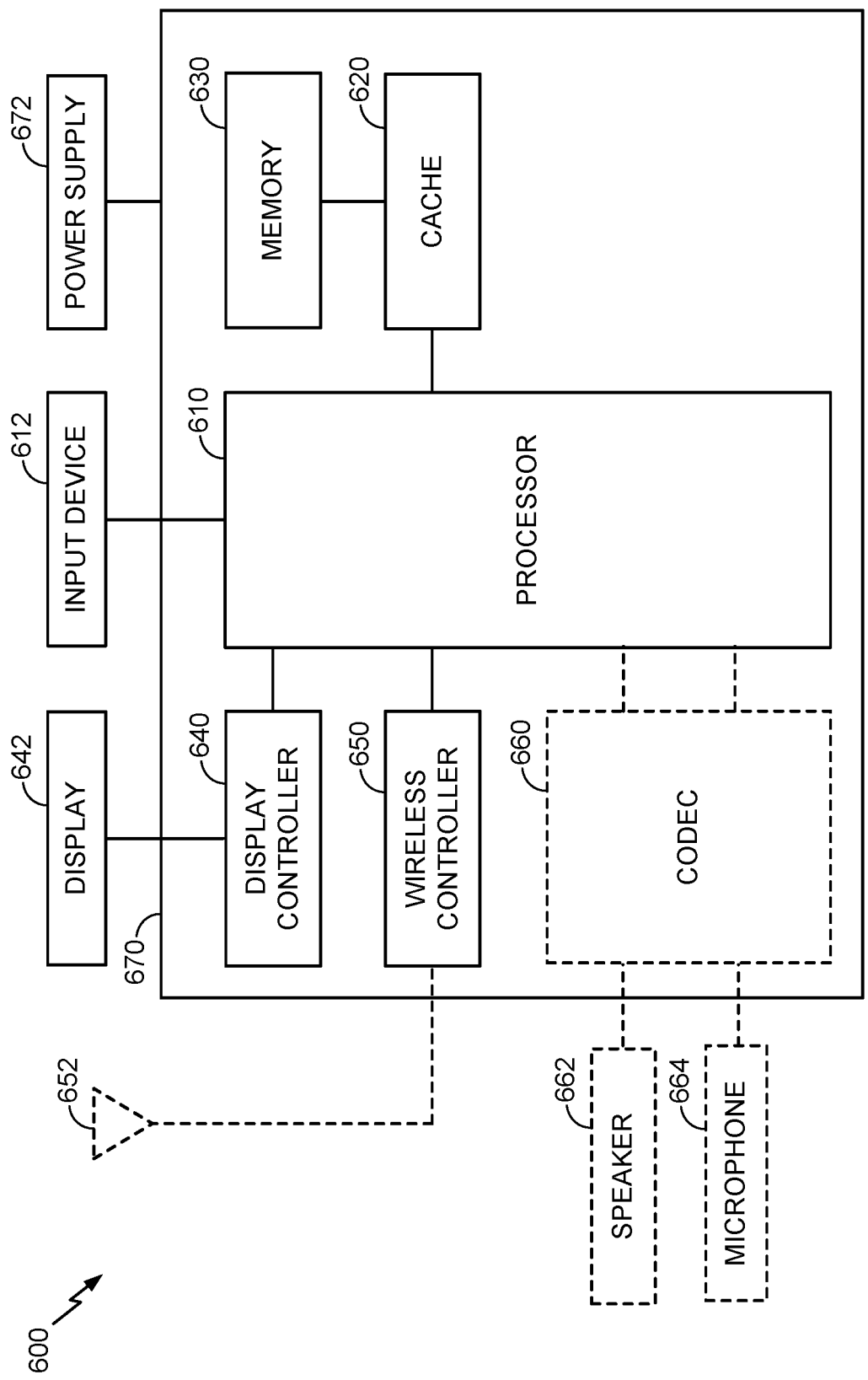
FIG. 6 generally illustrates an exemplary electronic device in which an aspect of the disclosure may be advantageously employed.

FIG. 6 generally illustrates an exemplary electronic device 600 in which an aspect of the disclosure may be advantageously employed.

Electronic device 600 may incorporate the comparator architecture 100 depicted in FIGS. 1-2, the comparator architecture 300 depicted in FIG. 3, the comparator architecture 400 depicted in FIG. 4, and/or any combination thereof. In the depiction of FIG. 6, electronic device 600 is shown to include a processor 610. Electronic device 600 may further comprise a cache 620. In FIG. 6, processor 610 is exemplarily shown to be coupled to memory 630 with cache 620 between processor 610 and memory 630, but it will be understood that other memory configurations known in the art may also be supported by electronic device 600.

FIG. 6 also depicts a display controller 640 that is coupled to processor 610 and to display 642. In some cases, electronic device 600 may be used for wireless communication. FIG. 6 depicts optional blocks in dashed lines, such as coder/decoder (CODEC) 660 (e.g., an audio and/or voice CODEC) coupled to processor 610. A speaker 662 and a microphone 664 may also be coupled to CODEC 660. Moreover, a wireless antenna 652 may be coupled to a wireless controller 650 which is coupled to processor 610. Where one or more of these optional blocks are present, in a particular aspect, processor 610, display controller 640, memory 630, and wireless controller 650 are included in a system-in-package or system-on-chip device 670.

Accordingly, in a particular aspect, an input device 612 and a power supply 672 are coupled to the system-on-chip device 670. Moreover, in a particular aspect, as illustrated in FIG. 6, where one or more optional blocks are present, display 642, input device 612, speaker 662, microphone 664, wireless antenna 652, and power supply 672 are external to the system-on-chip device 670. However, each of display 642, input device 612, speaker 662, microphone 664, wireless antenna 652, and power supply 672 can be coupled to a component of the system-on-chip device 670, such as an interface or a controller. In some implementations, one or more of the components of the electronic device 600 may communicate with one another via a system bus.

It should be noted that although FIG. 6 generally depicts a generic electronic device 600, one or more of the components of the electronic device 600 may additionally or alternatively be integrated into a set top box, a music player, a video player, an entertainment unit, a navigation device, a personal digital assistant (PDA), a fixed location data unit, a computer, a laptop, a tablet, a communications device, a mobile phone, or other similar devices.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an aspect of the invention can include a computer-readable media embodying a method for bus control. Accordingly, the invention is not limited to illustrated examples and any means for performing the functionality described herein are included in aspects of the invention.

In view of the descriptions and explanations above, one skilled in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Accordingly, it will be appreciated, for example, that an apparatus or any component of an apparatus may be configured to (or made operable to or adapted to) provide functionality as taught herein. This may be achieved, for example: by manufacturing (e.g., fabricating) the apparatus or component so that it will provide the functionality; by programming the apparatus or component so that it will provide the functionality; or through the use of some other suitable implementation technique. As one example, an integrated circuit may be fabricated to provide the requisite functionality. As another example, an integrated circuit may be fabricated to support the requisite functionality and then configured (e.g., via programming) to provide the requisite functionality. As yet another example, a processor circuit may execute code to provide the requisite functionality.

Moreover, the methods, sequences, and/or algorithms described in connection with the aspects disclosed herein may be embodied directly in hardware, in a software module executed by a processor, or in a combination of the two. A software module may reside in Random-Access Memory (RAM), flash memory, Read-only Memory (ROM), Erasable Programmable Read-only Memory (EPROM), Electrically Erasable Programmable Read-only Memory (EEPROM), registers, hard disk, a removable disk, a CD-ROM, or any other form of non-transitory storage medium known in the art. As used herein the term "non-transitory" does not exclude any physical storage medium or memory and particularly does not exclude dynamic memory (e.g., RAM) but rather excludes only the interpretation that the medium can be construed as a transitory propagating signal. An example storage medium is coupled to the processor such that the processor can read information from, and write information to, the storage medium. In the alternative, the storage medium may be integral to the processor (e.g., cache memory).

While the foregoing disclosure shows various illustrative aspects, it should be noted that various changes and modifications may be made to the illustrated examples without departing from the scope defined by the appended claims. The present disclosure is not intended to be limited to the specifically illustrated examples alone. For example, unless otherwise noted, the functions, steps, and/or actions of the apparatus claims in accordance with the aspects of the disclosure described herein need not be performed in any particular order. Furthermore, although certain aspects may be described or claimed in the singular, the plural is contemplated unless limitation to the singular is explicitly stated.

It will be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not imply that there are only two elements and further does not imply that the first element must precede the second element in some manner. Also, unless stated otherwise a set of elements may comprise one or more elements. In addition, terminology of the form "at least one of A, B, or C" or "one or more of A, B, or C" or "at least one of the group consisting of A, B, and C" used in the description or the claims means "A or B or C or any combination of these elements".

The terminology used herein is for the purpose of describing particular embodiments only and not to limit any embodiments disclosed herein. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof. Similarly, the phrase "based on" as used herein does not necessarily preclude influence of other factors and should be interpreted in all cases as "based at least in part on" rather than, for example, "based solely on".

It will be understood that terms such as "top" and "bottom", "left" and "right", "vertical" and "horizontal", etc., are relative terms used strictly in relation to one another, and do not express or imply any relation with respect to gravity, a manufacturing device used to manufacture the components described herein, or to some other device to which the components described herein are coupled, mounted, etc. The term "exchange" may refer to one or more data transfers from one component to another. For example, with respect to a particular component, exchanging functionality may be constituted by sending functionality, receiving functionality, or any combination thereof.

What is claimed is:

1. A circuit comprising:
   a first stage configured to receive an input voltage and a reference voltage, the first stage comprising a reference transistor pair and a clamp transistor, wherein:
   the reference voltage is coupled to the reference transistor pair;
   the reference transistor pair is coupled to ground;
   the reference transistor pair comprises at a common drain a drain-gate node having a drain-gate voltage; and
   a source of the clamp transistor is coupled to a high-gain node, a gate of the clamp transistor is coupled to a clamp voltage, and
   a second stage coupled to the high-gain node and configured to generate an output voltage based on a difference between the input voltage and the reference voltage, the second stage comprising a resistor and an inverter transistor pair, wherein:
   gates of the inverter transistor pair are coupled to the high-gain node of the first stage; and
   the resistor couples the high-gain node of the first stage to a common drain of the inverter transistor pair and is configured to provide and/or draw current to and/or from the high-gain node of the first stage.

2. The circuit of claim 1, wherein the first stage further comprises an input transistor pair, wherein:
   the input voltage is coupled to the input transistor pair;
   the input transistor pair is coupled to the ground;
   the input transistor pair comprises at a common drain the high-gain node having a high-gain node voltage; and
   the drain-gate node is coupled to respective gates of p-type transistors in the input transistor pair and the reference transistor pair, respectively.

3. The circuit of claim 1, wherein the second stage is configured to draw current from the high-gain node when the high-gain node voltage rises.

4. The circuit of claim 1, wherein the second stage is configured to provide current to the high-gain node when the high-gain node voltage falls.

5. The circuit of claim 1, further comprising a third stage comprising an operational amplifier and a transistor and configured to:
   provide the input voltage, wherein the input voltage is provided based on a high-impedance input voltage and a high-voltage power supply; or
   provide the reference voltage, wherein the reference voltage is provided based on a high-impedance reference voltage and a high-voltage power supply.

6. The circuit of claim 1, further comprising a third stage that comprises a high-impedance input transistor pair and a high-impedance reference transistor pair, wherein:
   the high-impedance input transistor pair is configured to receive a high-impedance input voltage at gates of the high-impedance input transistor pair and provide to the first stage, from a common drain of the high-impedance input transistor pair, the input voltage; and
   the high-impedance reference transistor pair is configured to receive a high-impedance reference voltage at gates of the high-impedance reference transistor pair and provide to the first stage, from a common drain of the high-impedance reference transistor pair, the reference voltage.

7. The circuit of claim 6, wherein the third stage further comprises:
- a p-type transistor having a gate that is coupled to a p-type bias voltage, a source that is coupled to a power supply, and a drain that is coupled to a source of a p-type transistor in the high-impedance input transistor pair and a p-type transistor in the high-impedance reference transistor pair; and
- an n-type transistor having a gate that is coupled to an n-type bias voltage, a source that is coupled to ground, and a drain that is coupled to a source of an n-type transistor in the high-impedance input transistor pair and an n-type transistor in the high-impedance reference transistor pair.

8. The circuit of claim 1, wherein the first stage comprises a folded cascode, the folded cascode comprising:
- the input transistor pair;
- the reference transistor pair coupled to the reference voltage, coupled to ground, and comprising a reference transistor pair node coupled to drains of the reference transistor pair; and
- a low-impedance transistor pair coupled to a low-impedance voltage, coupled to ground, and comprising a low-impedance transistor pair node coupled to the drains of the low-impedance transistor pair, wherein:
  - the low-impedance transistor pair node is coupled to gates of p-type transistors in the low-impedance transistor pair, the input transistor pair, and the reference transistor pair.

9. The circuit of claim 8, wherein a drain of the clamp transistor coupled to the gates of p-type transistors in the input transistor pair and the reference transistor pair, respectively.

10. The circuit of claim 1, wherein the system is provided in a device selected from a group consisting of a set top box, a music player, a video player, an entertainment unit, a navigation device, a personal digital assistant (PDA), a fixed location data unit, a computer, a laptop, a tablet, a communications device, and a mobile phone.

11. A method, comprising:
receiving, at a first stage comprising a reference transistor pair, a clamp transistor, an input voltage and a reference voltage, wherein:
- the reference voltage is coupled to the reference transistor pair;
- the reference transistor pair is coupled to ground;
- the reference transistor pair comprises at a common drain a drain-gate node having a drain-gate voltage; and
- a source of the clamp transistor is coupled to a high-gain node, a gate of the clamp transistor is coupled to a clamp voltage; and receiving, at a second stage comprising a resistor and an inverter transistor pair, ae high-gain node voltage, wherein:
- gates of the inverter transistor pair are coupled to the high-gain node of the first stage; and
- the resistor couples the high-gain node of the first stage to a common drain of the inverter transistor pair;

providing or drawing current to or from the high-gain node of the first stage; and
generating an output voltage based on a difference between the input voltage and the reference voltage.

12. The method of claim 11, wherein the first stage further comprises an input transistor pair, wherein:
- the input voltage is coupled to the input transistor pair;
- the input transistor pair is coupled to the ground; and
- the input transistor pair comprises at a common drain the high-gain node having the high-gain node voltage; and
- the drain-gate node is coupled to respective gates of p-type transistors in the input transistor pair and the reference transistor pair, respectively.

13. The method of claim 11, further comprising drawing current from the high-gain node when the high-gain node voltage rises.

14. The method of claim 11, further comprising providing current to the high-gain node when the high-gain node voltage falls.

15. The method of claim 11, further comprising:
providing, from a third stage comprising an operational amplifier and a transistor, the input voltage, wherein the input voltage is provided based on a high-impedance input voltage and a high-voltage power supply; and/or
providing, from the third stage, the reference voltage, wherein the reference voltage is provided based on a high-impedance reference voltage and a high-voltage power supply.

16. The method of claim 11, further comprising:
receiving, at a third stage that comprises a high-impedance input transistor pair, a high-impedance input voltage at gates of the high-impedance input transistor pair;
providing to the first stage, from a common drain of the high-impedance input transistor pair, the input voltage;
receiving, at a high-impedance reference transistor pair in the third stage, a high-impedance reference voltage at gates of the high-impedance reference transistor pair; and
providing to the first stage, from a common drain of the high-impedance reference transistor pair, the reference voltage.

17. The method of claim 16, wherein the third stage further comprises:
- a p-type transistor having a gate that is coupled to a p-type bias voltage, a source that is coupled to a power supply, and a drain that is coupled to a source of a p-type transistor in the high-impedance input transistor pair and a p-type transistor in the high-impedance reference transistor pair; and
- an n-type transistor having a gate that is coupled to an n-type bias voltage, a source that is coupled to ground, and a drain that is coupled to a source of an n-type transistor in the high-impedance input transistor pair and an n-type transistor in the high-impedance reference transistor pair.

18. The method of claim 11, wherein the first stage comprises a folded cascode, the folded cascode comprising:
- the input transistor pair;
- a reference transistor pair coupled to the reference voltage, coupled to ground, and comprising a reference transistor pair node coupled to drains of the reference transistor pair; and
- a low-impedance transistor pair coupled to a low-impedance voltage, coupled to ground, and comprising a low-impedance transistor pair node coupled to the drains of the low-impedance transistor pair, wherein:
  - the low-impedance transistor pair node is coupled to gates of p-type transistors in the low-impedance transistor pair, the input transistor pair, and the reference transistor pair.

19. The method of claim 18, wherein a drain of the clamp transistor is coupled to the gates of p-type transistors in the input transistor pair and the reference transistor pair, respectively.

20. The method of claim 11, wherein the method is implemented in a device selected from a group consisting of a set top box, a music player, a video player, an entertainment unit, a navigation device, a personal digital assistant (PDA), a fixed location data unit, a computer, a laptop, a tablet, a communications device, and a mobile phone.

21. A circuit, comprising:
means for receiving an input voltage and a reference voltage, wherein the means for receiving comprises means for providing a drain-gate voltage and means for clamping a high-gain node;
means for providing or drawing current to or from the high-gain node of a first stage; and
means for generating an output voltage based on a difference between the input voltage and the reference voltage.

22. The circuit of claim 21, wherein the means for receiving further comprises means for providing the high-gain node having a high-gain node voltage and means for receiving the high-gain node voltage.

23. The circuit of claim 21, wherein the means for providing or drawing current comprises means for drawing current from the high-gain node when the high-gain node voltage rises.

24. The circuit of claim 21, wherein the means for providing or drawing current comprises means for providing current to the high-gain node when the high-gain node voltage falls.

25. The circuit of claim 21, further comprising means for increasing impedance, the means for increasing impedance further comprising:
means for providing the input voltage, wherein the input voltage is provided based on a high-impedance input voltage and a high-voltage power supply; or
means for providing the reference voltage, wherein the reference voltage is provided based on a high-impedance reference voltage and a high-voltage power supply.

26. The circuit of claim 21, further comprising means for increasing impedance, the means for increasing impedance further comprising:
means for receiving a high-impedance input voltage and a high-impedance reference voltage; and
means for providing the input voltage and the reference voltage to the means for receiving.

27. The circuit of claim 26, wherein the means for increasing impedance further comprises:
means for providing current to the means for increasing impedance, wherein the means for providing current is coupled to a power supply; and
means for sinking current from the means for increasing impedance, wherein the means for sinking current is coupled to ground.

28. The circuit of claim 21, wherein the means for receiving comprises a folded cascode, the folded cascode comprising:
an input transistor pair;
a reference transistor pair coupled to the reference voltage, coupled to ground, and comprising a reference transistor pair node coupled to drains of the reference transistor pair; and
a low-impedance transistor pair coupled to a low-impedance voltage, coupled to ground, and comprising a low-impedance transistor pair node coupled to the drains of the low-impedance transistor pair, wherein:
the low-impedance transistor pair node is coupled to gates of p-type transistors in the low-impedance transistor pair, the input transistor pair, and the reference transistor pair.

29. The circuit of claim 21, wherein the means for clamping the high-gain node is coupled to the means for providing the high-gain node and the means for providing the drain-gate voltage.

30. The circuit of claim 21, wherein the system is provided in a device selected from a group consisting of a set top box, a music player, a video player, an entertainment unit, a navigation device, a personal digital assistant (PDA), a fixed location data unit, a computer, a laptop, a tablet, a communications device, and a mobile phone.

* * * * *